US006646196B2

(12) United States Patent
Fronek et al.

(10) Patent No.: US 6,646,196 B2
(45) Date of Patent: Nov. 11, 2003

(54) WINDOW STRUCTURE WITH PHOTOVOLTAIC PANEL

(75) Inventors: Steven B. Fronek, Rothschild, WI (US); Thomas M. Mifflin, Antigo, WI (US)

(73) Assignee: Apogee Enterprises, Inc., Minneapolis, MN (US)

( * ) Notice: Subject to any disclaimer, the term of this patent is extended or adjusted under 35 U.S.C. 154(b) by 0 days.

(21) Appl. No.: 09/995,199

(22) Filed: Nov. 26, 2001

(65) Prior Publication Data

US 2003/0098056 A1 May 29, 2003

(51) Int. Cl.[7] .................... H01L 31/048; H01L 31/042
(52) U.S. Cl. .................... 136/251; 136/244; 136/291; 136/293; 52/173.3
(58) Field of Search ................. 136/251, 244, 136/291, 293; 52/173.3

(56) References Cited

U.S. PATENT DOCUMENTS

| 3,952,947 A | | 4/1976 | Saunders | |
| 4,137,098 A | | 1/1979 | Field | |
| 4,294,038 A | * | 10/1981 | Davidson | 49/63 |
| 5,128,181 A | | 7/1992 | Kunert | 428/34 |
| 5,217,000 A | | 6/1993 | Pierce-Bjorklund | 126/621 |
| 5,221,363 A | | 6/1993 | Gillard | 136/248 |
| 5,347,779 A | | 9/1994 | Jordan | 52/302.3 |
| 5,524,401 A | * | 6/1996 | Ishikawa et al. | 52/173.3 |
| 5,760,558 A | | 6/1998 | Popat | 318/480 |
| 6,300,555 B1 | * | 10/2001 | Kondo et al. | 136/244 |
| 6,410,843 B1 | * | 6/2002 | Kishi et al. | 136/246 |

FOREIGN PATENT DOCUMENTS

| JP | 11-261287 A | * | 9/1999 |
| JP | 2001-98856 A | * | 4/2001 |
| WO | WO-99/07022 A1 | * | 2/1999 |

* cited by examiner

*Primary Examiner*—Alan Diamond
(74) *Attorney, Agent, or Firm*—Dorsey & Whitney LLP

(57) ABSTRACT

A multi-paneled window structure in which at least one panel is a photovoltaic panel and at least one other panel is a window panel comprised of vision glass.

13 Claims, 8 Drawing Sheets

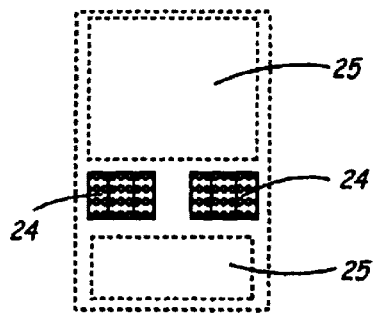
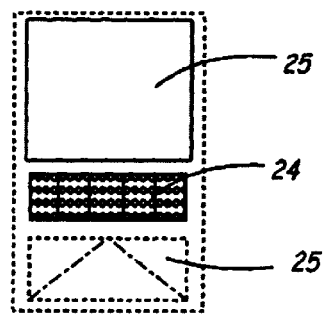
FIG. 12A  FIG. 12B
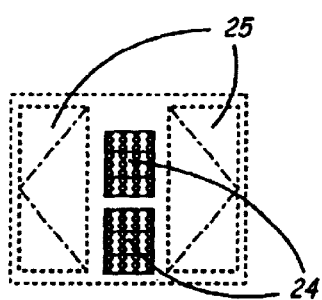
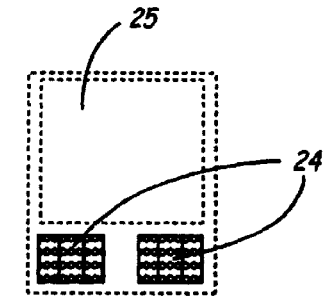
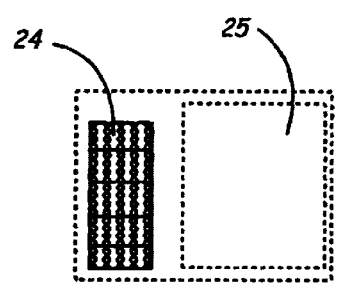
FIG. 12C  FIG. 12D  FIG. 12E
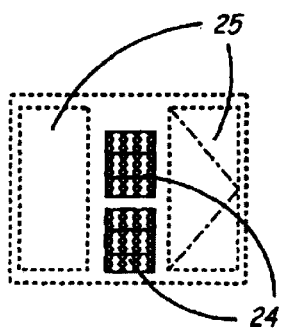
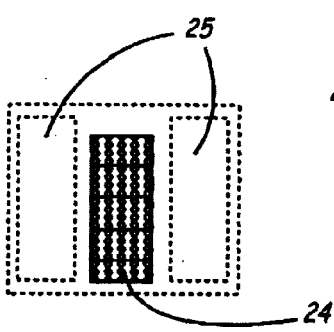
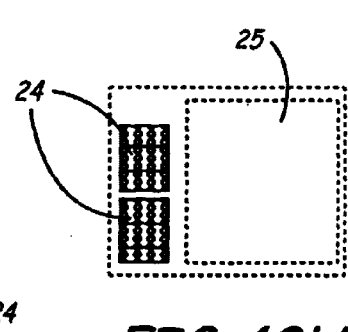
FIG. 12F  FIG. 12G  FIG. 12H

WINDOW STRUCTURE WITH PHOTOVOLTAIC PANEL

BACKGROUND OF THE INVENTION

1. Field of the Art

The present invention relates generally to window structures and more particularly to window structures comprising a photovoltaic panel. More specifically, the present invention relates to a multi-paneled window in which at least one of such panels is comprised of a photovoltaic panel and at least one other panel is comprised of vision glass.

2. Description of the Prior Art

Photovoltaic (PV) modules comprised of a plurality of photovoltaic (PV) cells are commercially available from many manufacturers in various sizes and power outputs. These cells are connected in a circuit (either series or parallel) for battery charging or other applications.

Various patents have disclosed the use of photovoltaic technology for a variety of applications. The Kunert U.S. Pat. No. 5,128,181 utilizes a PV unit mounted on the inner side of the glass pane of a window to generate electrical energy to feed an electrical heating resistance. This patent, however, does not disclose a multi-paneled window structure. Sanders U.S. Pat. No. 3,952,947 discloses a heating and ventilating system which uses photovoltaic cells to generate an electromagnetic force to charge a system battery. The Gillard U.S. Pat. No. 5,221,363 discloses a window blind with-photovoltaic solar cells mounted to the window blind. The Field U.S. Pat. No. 4,137,098 discloses a solar energy window having a plurality of slats covered with an array of photovoltaic cells enclosed between two panes of glass.

Photovoltaic panels have also been used as roof-mounted PV arrays and as part of a building structure as Building Integrated Photovoltaics (BIPV) for the purpose of generating electrical energy. However, photovoltaic modules or panels have not been incorporated into a multi-paneled Window to provide electrical energy for functional, educational or other purposes.

Accordingly, there is a need in the art for a window structure with a photovoltaic module incorporated therein and more specifically, there is a need for a multi-paneled window structure in which at least one such panel is comprised of a photovoltaic panel and at least one other panel is comprised of vision glass.

SUMMARY OF THE INVENTION

In contrast to the prior art, the present invention provides a unique application for a photovoltaic module by incorporating a self-contained photovoltaic module into a multi-paneled window structure. Specifically, the invention relates to a photovoltaic module for use as one of a plurality of panels of a multi-paneled window structure which also includes at least one other window panel of vision glass. In a preferred embodiment, the window structure is a pre-formed window with standard or custom dimensions in which the window structure includes a plurality of panels, with at least one panel embodying the photovoltaic module and at least one other panel embodying vision glass. Preferably, the PV panel for application in the present invention is a totally self-contained unit having a thickness approximating that of a conventional window frame and having the photovoltaic module, the electrical power storage means as well as other desired control and/or DC to AC inverter means and the like incorporated into the photovoltaic panel itself.

The window structure in accordance with the present invention has applicability for powering various loads such as clocks, lights, meters, display panels and the like as well as having enormous educational potential for use as a portion of a multi-paneled school window.

Accordingly, it is an object of the present invention to provide a window structure having a photovoltaic panel.

Another object of the present invention is to provide a multi-paneled window structure in which at least one panel is comprised of a photovoltaic panel and at least one other panel is comprised of vision glass.

Another object of the present invention is to provide a photovoltaic panel for use in a multi-paneled window structure.

A still further object of the present invention is to provide a photovoltaic panel for use in a window structure in which the photovoltaic panel is totally self-contained.

These and other objects of the present invention will become apparent with reference to the drawings, the description of the preferred embodiment and the appended claims.

DESCRIPTION OF THE DRAWINGS

FIG. 4 is a view, partially in section, as viewed along the section line 4—4 of FIG. 1.

FIGS. 12A through 12H are illustrations showing various alternate configurations of photovoltaic window structures in accordance with the present invention.

DESCRIPTION OF THE PREFERRED EMBODIMENT

Figure 1:
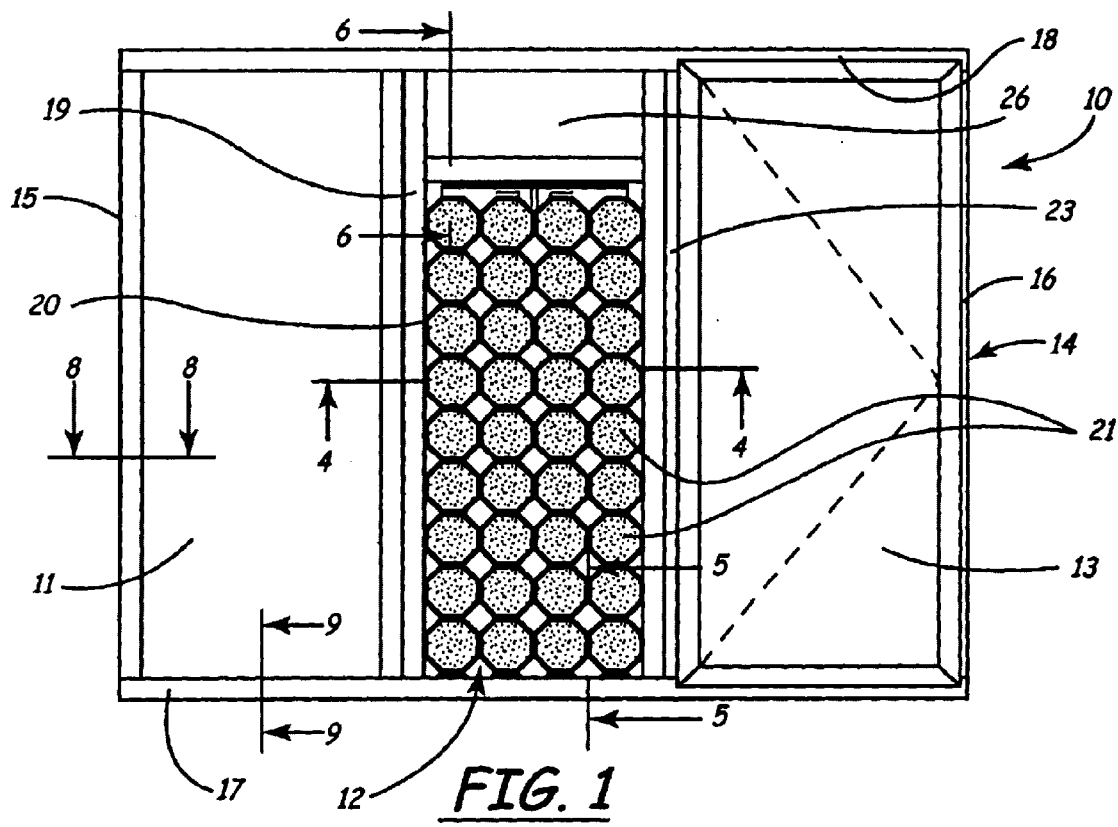
FIG. 1 is a front elevational view of the window structure in accordance with the present invention as viewed from the exterior side of the structure.
Figure 2:
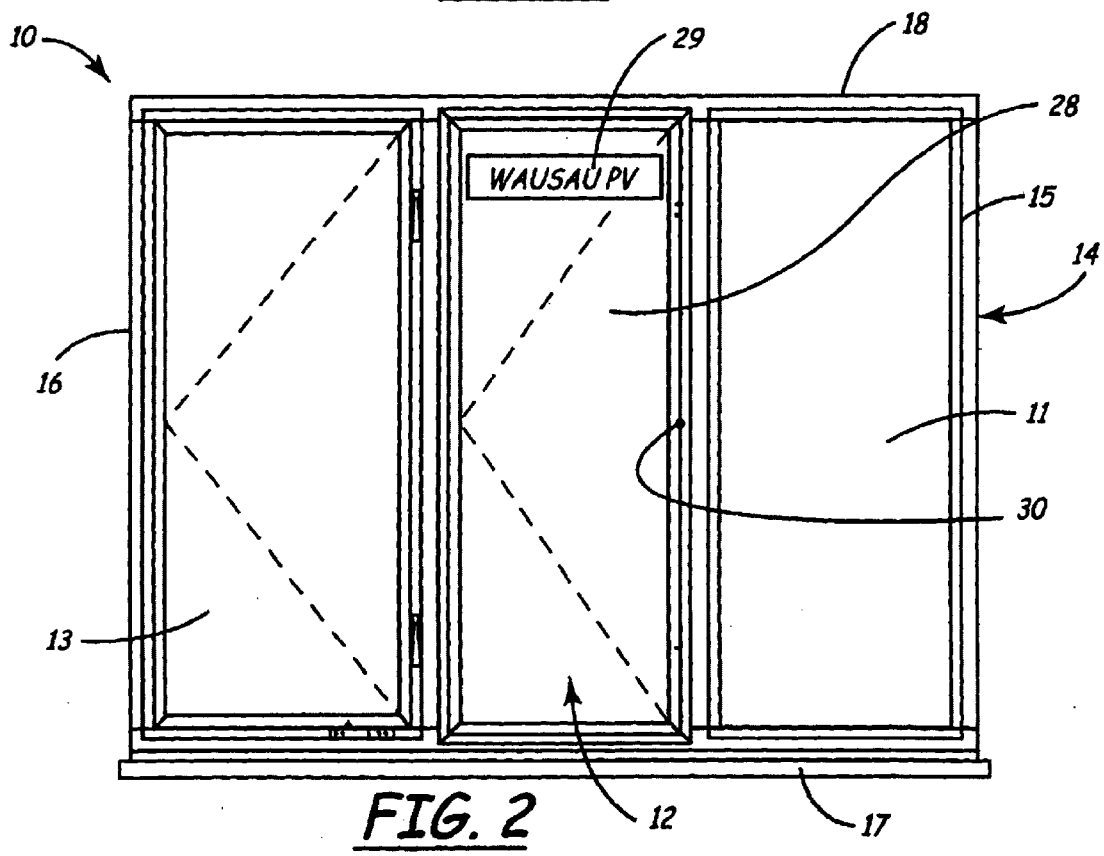
FIG. 2 is a rear elevational view of the window structure in accordance with the present invention as viewed from the interior side of the structure.

Reference is first made to FIGS. 1 and 2 showing the exterior and interior sides, respectively, of the window structure in accordance with the present invention. As shown, the window structure is a multi-paneled window 10 having a plurality of panels in which at least one of the panels is comprised of a photovoltaic (PV) panel and at least one other panel is a window panel (either fixed or operable) comprised of vision glass. In the embodiment shown in FIGS. 1 and 2, the multi-paneled window 10 is comprised of three panels 11, 12 and 13 in which the panels 11 and 13 are conventional fixed and operable window panels containing vision glass and the panel 12 is a PV panel.

In the preferred embodiment, the multi-paneled window 10 includes an exterior frame 14 comprised of vertical frame members 15 and 16 and horizontal frame members 17 and 18 which are joined together in a conventional manner to form the perimeter or exterior frame of the multi-paneled window 10. The frame members 15, 16, 17 and 18 may comprise both an installation frame or receptor and an inner frame such as a jamb, head or sill frame or, in some cases, may comprise only an inner frame member. A pair of millions 19 and 23 extend between the horizontal frame members 17 and 18 and function to separate the panels 11 and 12, and 12 and 13, respectively. In addition to the perimeter frame 14, each of the panels 11, 12 and 13 is preferably provided with frame or mounting components to mount the panels within the perimeter frame 14. Although the details of these frame and mounting components are shown in FIGS. 4, 5, 6, 8 and 9, the mounting of the PV panel 12 and the window panels 11 and 13 within the perimeter frame 14 can be accomplished by any means known in the art.

With continuing reference to FIG. 1, the PV panel 12 includes a photovoltaic (PV) module 20 which is comprised of a plurality of PV cells 21. PV cells convert sunlight energy into direct electric current. PV cells are conventionally electrically connected to one another in series to provide a PV module such as the module 20 shown in FIG. 1, although they can also be connected in parallel for some applications. PV modules are commercially available from manufacturers in various standard sizes and power outputs. Many, such as the module 20 in the preferred embodiment are configured with 36 PV or solar cells connected in series to provide 18 volts DC nominal when in full sun. Examples of PV modules usable in the PV panel 12 of the present invention include a Siemens Solar SP-75 module manufactured by Siemens Solar and the BP Solar BP-1218CZ module manufactured BP Solarex. To be functional in accordance with the present invention, the PV module 20 and its PV cells 21 must be located on the exterior or outer side of the PV panel 12 so that the cells 21 are exposed to full sunlight when available.

In the embodiment shown in FIG. 1, the PV panel 12 extends vertically and is positioned between the window panels 11 and 13. It is contemplated, however, that many other combinations and configurations of PV panels and window panels can be provided in accordance with the present invention. Examples of various combinations are shown in FIGS. 12A through 12H in which the PV panels are identified by the reference numerals 24 and the window panels are identified by the reference numerals 25. In the embodiment of FIG. 1, the window panels 11 and 13 and the PV panel 12 extend the full vertical length between the frame members 17 and 18. The upper end of the PV panel 12, above the PV module 20, is provided with aspacer panel 26.

Figure 3:
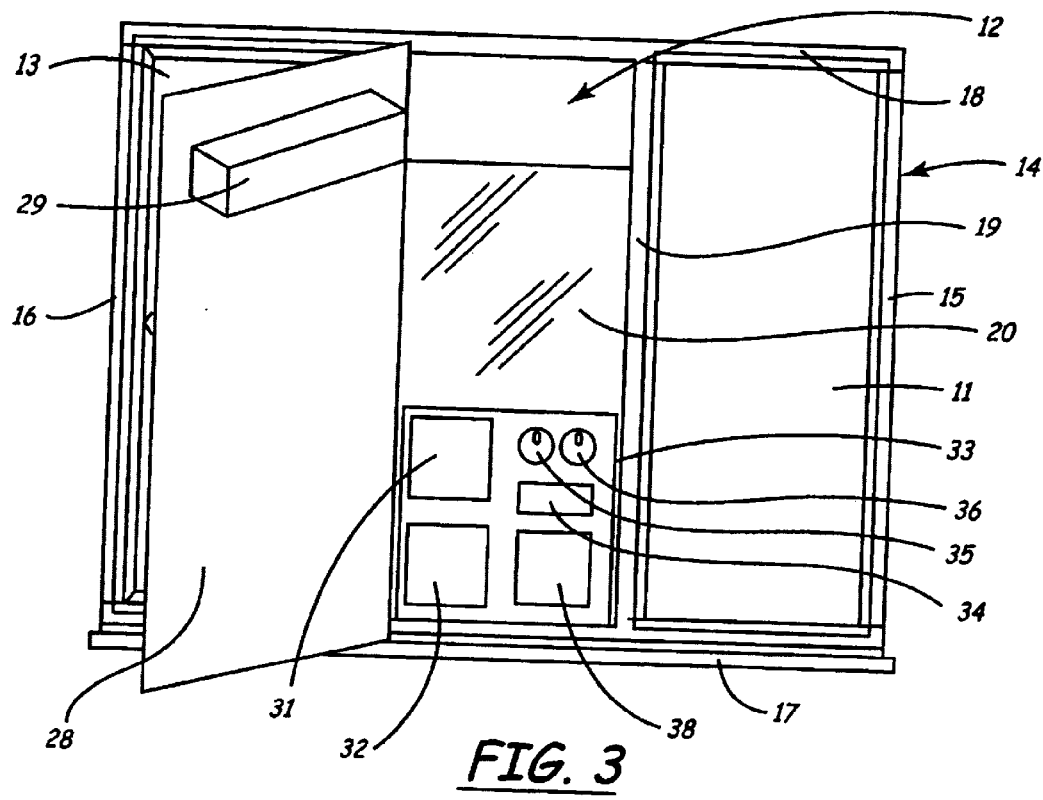
FIG. 3 is a view similar to that of FIG. 2, but with the hinged access door in an open position.

Reference is next made to FIGS. 2 and 3 showing the interior or inner side ofthe multi-paneled window 10. The interior side of the window panels 11 and 13 are similar to the exterior side shown in FIG. 1. The interior side of the PV panel 12, however, is provided with an access door 28. The access door 28 is hinged along one edge of the PV panel 12 to provide selective access to the interior of the PV panel 12. An upper portion of the access door 28 is provided with a light emitting diode (LED) display 29, with the display portion of the LED facing outwardly from the access door 28. The access door 28 may also be provided with one or more latch mechanisms 30 for selectively locking the door 28 in a closed position when desired. In the preferred embodiment, the LED display 29 is a Pro-Lite scrolling, programmable LED display manufactured by Pro-Lite. The display 29 may be controlled via PC link 59 (FIG. 10) or a handheld remote control. In the preferred embodiment, the LED display 29 is electrically connected to the electrical power supplied by the PV module 20 (FIG. 1).

As shown best in FIG. 3, the PV panel 12 includes a PV panel interior portion or cavity which houses the PV module 20 and the means for collecting, storing and controlling the electrical power generated by the PV module 20. The PV panel interior is defined on its front and back by the exterior and interior sides of the PV panel 12, respectively, and along its edges by a peripheral edge frame or support structure which supports the exterior and interior sides of the panel 12 and maintains those sides in spaced relationship. Preferably the distance between the exterior and interior sides of the PV panel 12 is no greater than that of a conventional window frame or casing and is preferably no greater than four inches.

Figure 7:
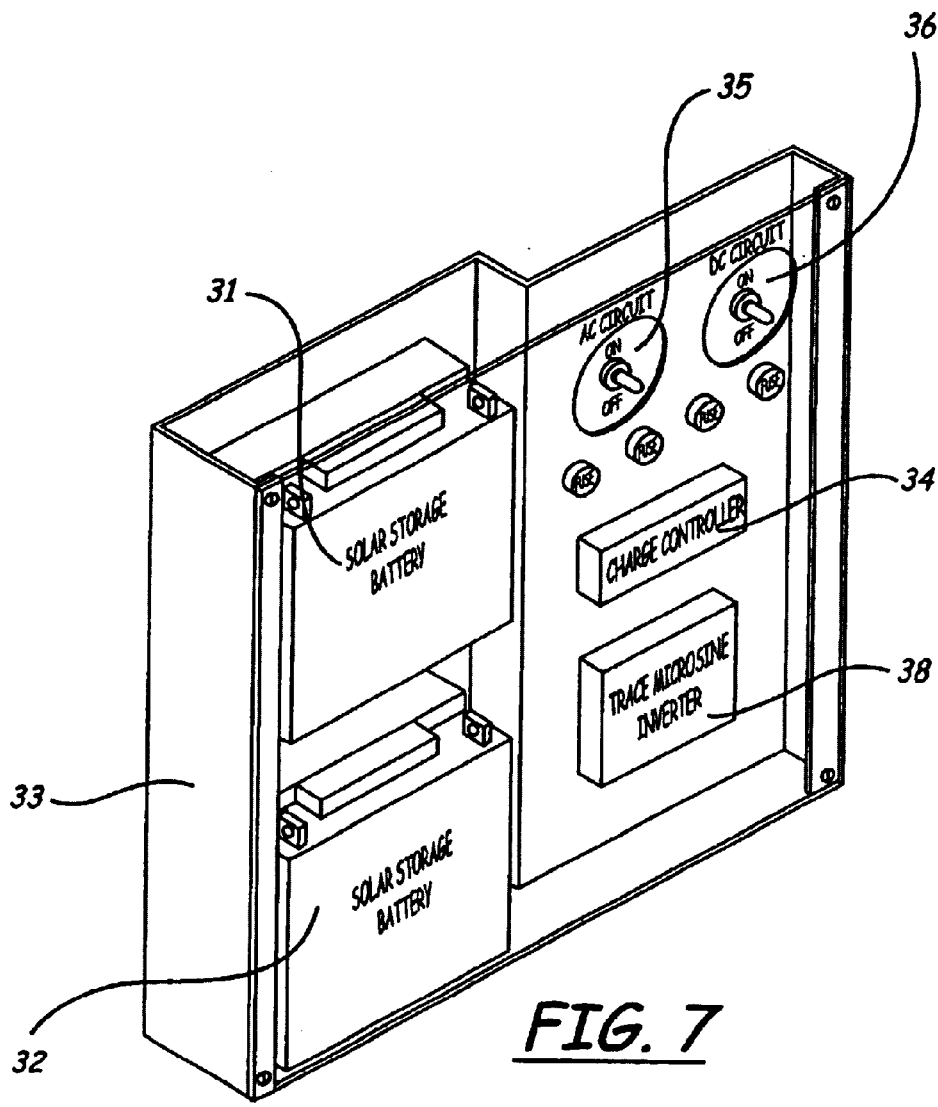
FIG. 7 is an isometric view of the component assembly for the photovoltaic panel of the present invention.

As shown in FIGS. 3 and 7, the interior of the PV panel 12 is provided with a component assembly having a component housing 33 and DC processing equipment, AC processing equipment, or both. In the preferred embodiment, the interior of the PV panel 12 is provided with both DC and AC processing equipment. Specifically, the interior of the PV panel 12 includes a pair of storage batteries 31 and 32, a charge controller 34, a pair of switches 35 and 36 to control AC and DC operation, respectively, and a DC to AC inverter.38. Each of these components is interconnected with one another and with the PV module 20 in accordance with the circuit diagrams illustrated in FIGS. 10 and 11.

In the preferred embodiment, the storage batteries 31 and 32 are preferably sealed lead acid gel cell batteries such as those sold under the X-Treme Plus name and made and sold by X-Treme Plus. The switches 35 and 36 are conventional toggle-type switches for activating either the AC or the DC output, respectively. The charge controller 34 functions to control the charging of the storage batteries 31 and 32. In the preferred embodiment, this controller is a Morningstar "Sun Saver 6" charge controller manufactured by Morningstar Corporation. The DC to AC inverter 38 is an inverter for converting DC to AC. In the preferred embodiment, this inverter is a "Micro-Sine" grid-tie inverter manufactured by Trace Engineering Company. The inverter 38 may be provided with a serial data port for remote monitoring via a PC 59 (FIG. 11) or other input means.

Although both AC and DC embodiments are shown in FIGS. 3 and 7, this would not be done in a typical application. In most applications, the interior of the PV panel 12 would be provided with either a DC embodiment or an AC embodiment, but not both. If electrical power from the PV module is intended for use outside of the panel 12 at a remote location, an appropriate power tap outlet 39 (FIG. 11) is provided.

Reference is next made to FIG. 4 showing a cross-section of the PV panel 12 and the frame portions or mullions 19 and 23 between the panel 12 and the window panels 11 and 13. In the preferred embodiment, the PV modules 20 are constructed of a glass cover sheet defining the exterior side of the module and a Tedlar back sheet encapsulating the plurality of solar cells. The module 20 is supported at its edges by a module frame 40. The module frame 40 is connected with the mullions 19 and 23 on each side of the PV panel by various frame and connection components conventional in the art.

The opposite or interior side of the PV panel 12 is defined by the access door 28 which is likewise mounted to the mullions 19 and 23 by conventional hinges. Conventional frame structure 42 is positioned between the access door 28 and the mullions 19 and 23 to connect the door 28 to one of the mullions. An upper central portion of the access door 28 includes an opening 46 for exposing the LED display 29. The display 29 includes a housing 44 and a power cable 45 extending from the display 29 to the charge controller 34. The display also includes a serial data line extending from the display 29 to the PC 59.

FIG. 4 also shows inner end portions of the window panels 11 and 13. Each of these window panels 11 and 13 includes insulating glass 48, an air spacer 49, a glazing stop 50 and seal means 51 between the glass 48 and a portion of the frame. The inner edges of the glass 48 are connected with the mullions 19 and 23 by conventional frame members.

Figure 5:
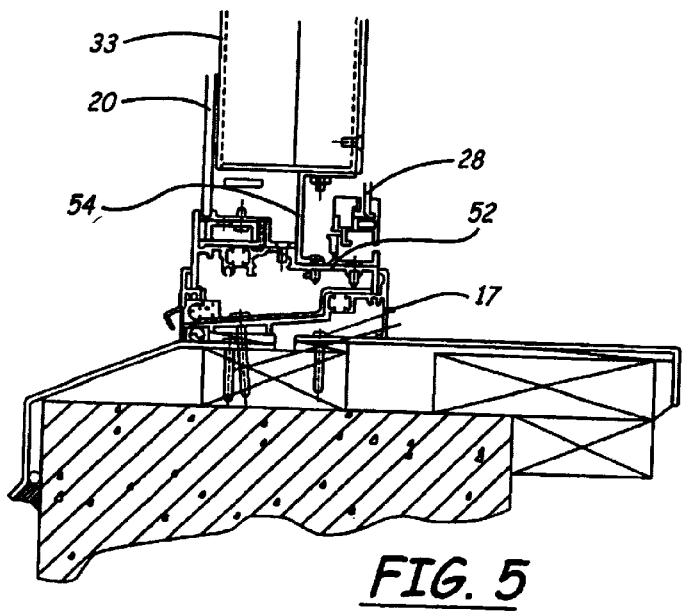
FIG. 5 is a view, partially in section, as viewed along the section line 5—5 of FIG. 1.

FIG. 5 is a cross-section showing the bottom portion of the PV panel 12 connected with the outer window frame and a portion of the component housing 33. As shown, the PV module 20 and the access door 28 are connected via various inner frame components 52 to the bottom installation window frame member or receptor 17. The component housing 33 is connected to the frame member 52 (which in the embodiment of FIG. 5 is a sill frame) via the support bracket 54.

Figure 6:
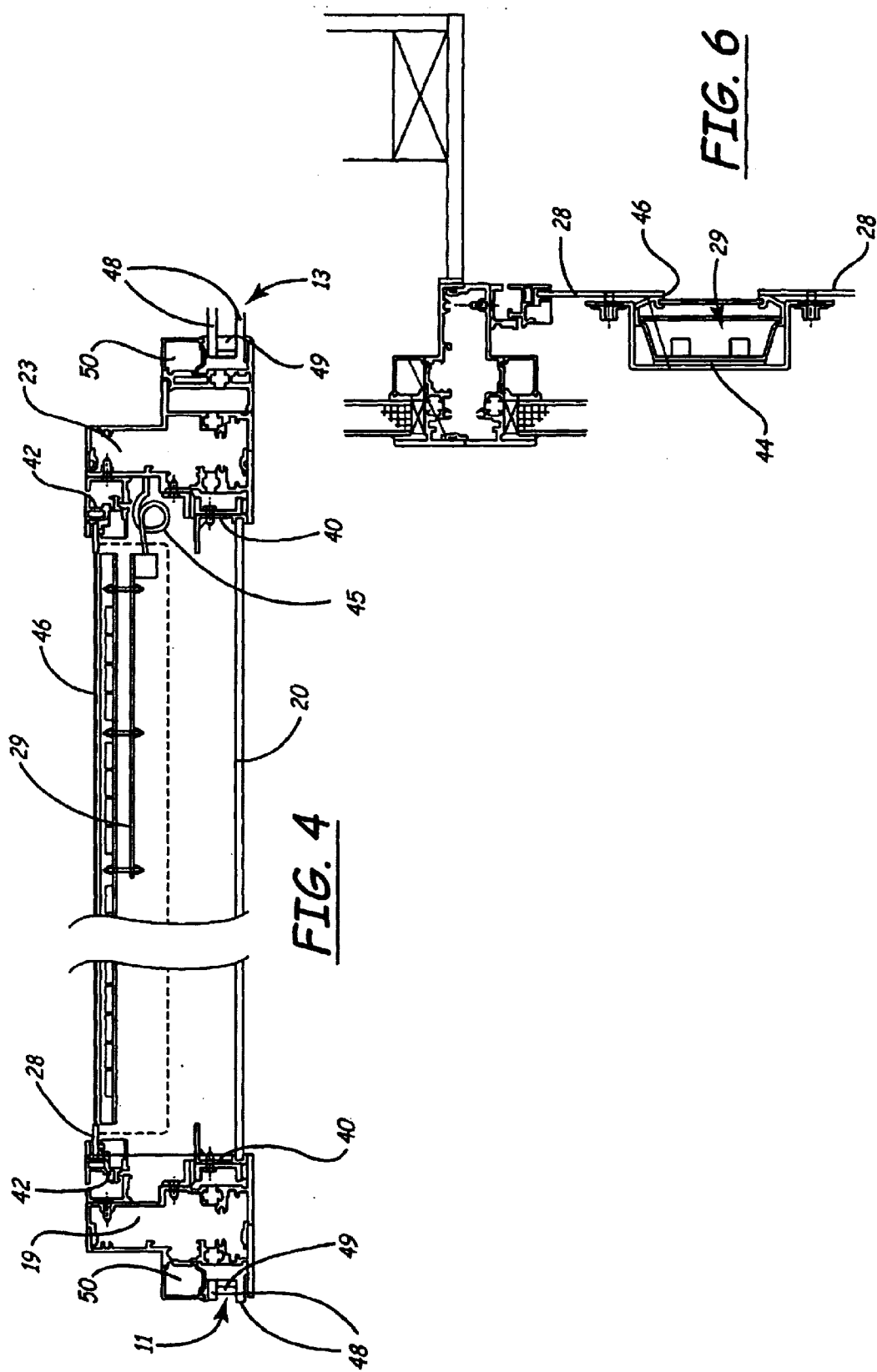
FIG. 6 is a view, partially in section, as viewed along the section line 6—6 of FIG. 1.

FIG. 6 is a cross-sectional view up of the upper portion of the access door 28 showing the LED display 29 and the display housing 44.

Figure 8:
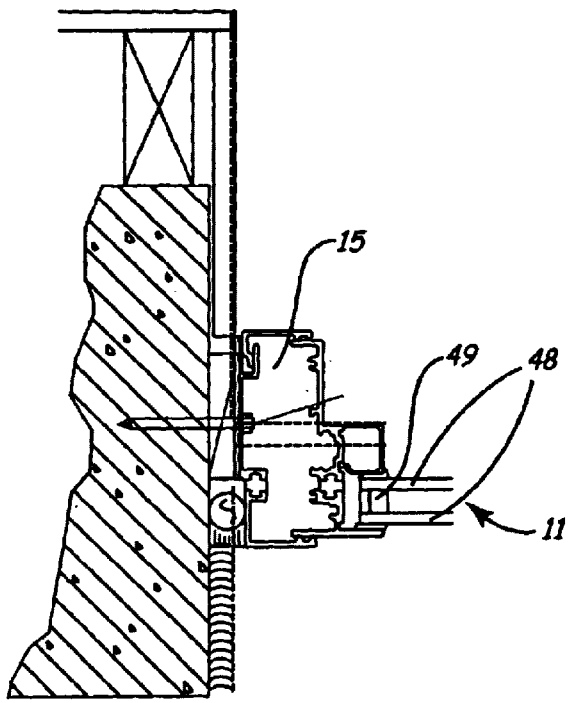
FIG. 8 is a view, partially in section, as viewed along the section line 8—8 of FIG. 1.
Figure 9:
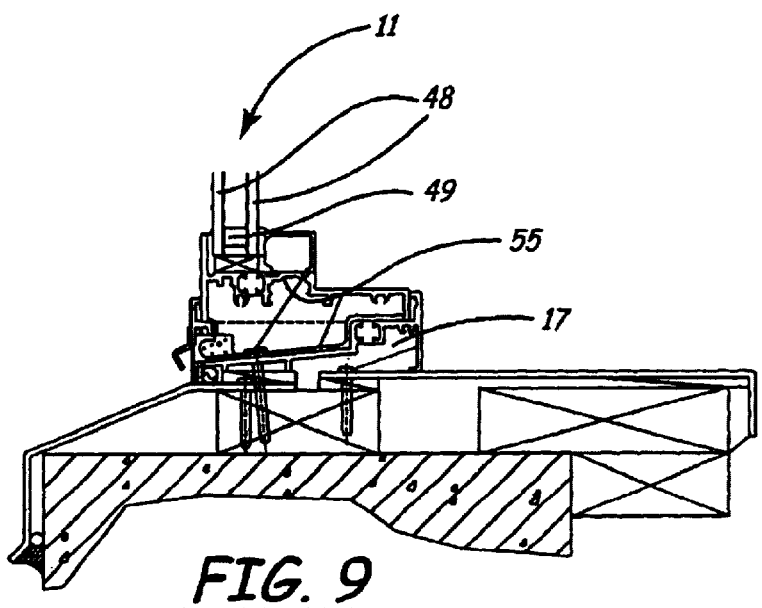
FIG. 9 is a view, partially in section, as viewed along the section line 9—9 of FIG. 1.

FIGS. 8 and 9 show cross-sectional views of the window panel 11 connected to the main installation window frame members 15 and 17. Similar to the connection of the window panels 11 and 13 to the mullions 19 and 23 in FIG. 4, the insulating glass unit 48 is connected to the frame members 15 and 17 through various conventional frame 55 and sealing 57 component.

Figure 10:
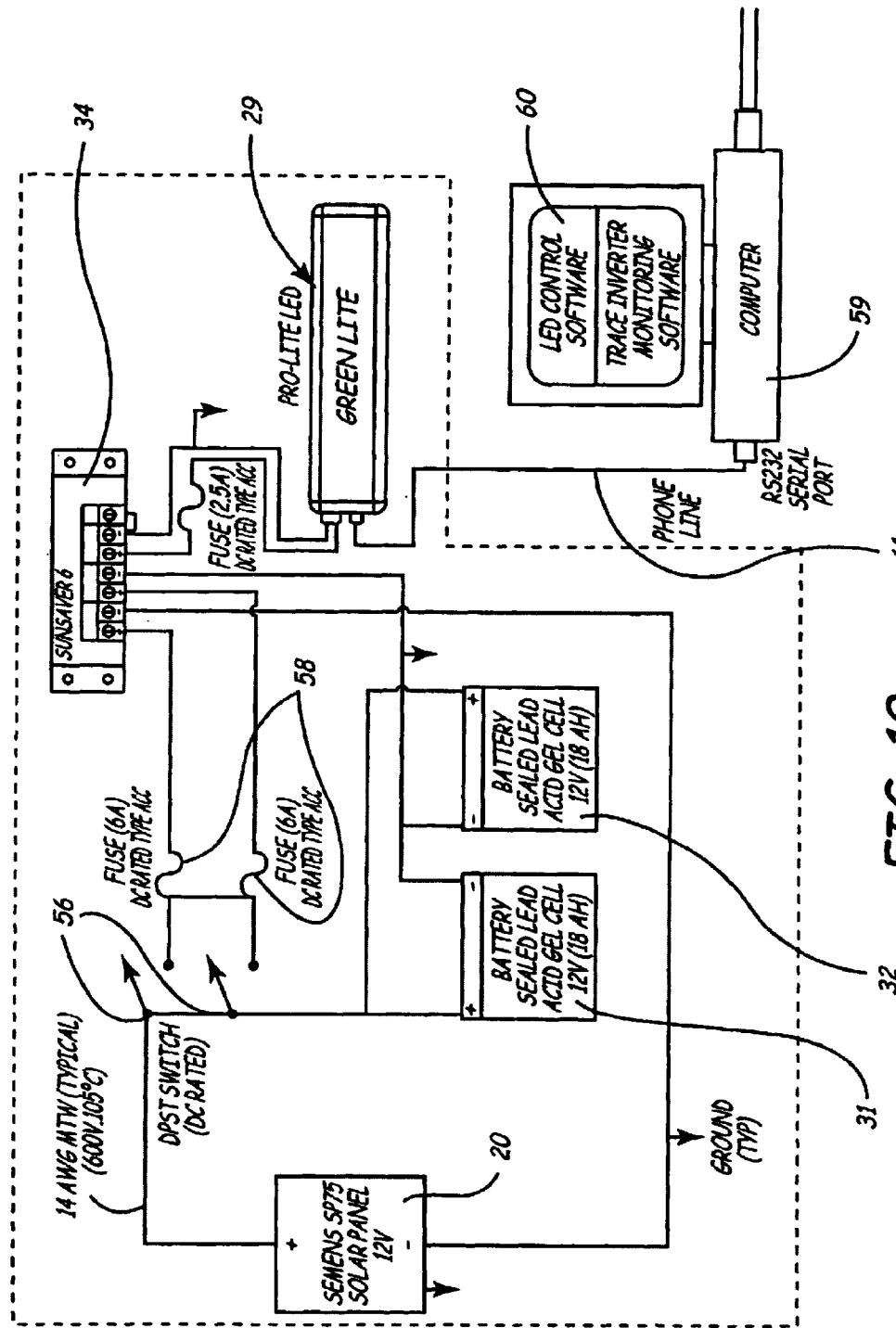
FIG. 10 is a wiring diagram for the DC embodiment of the photovoltaic panel in accordance with the present invention.
Figure 11:
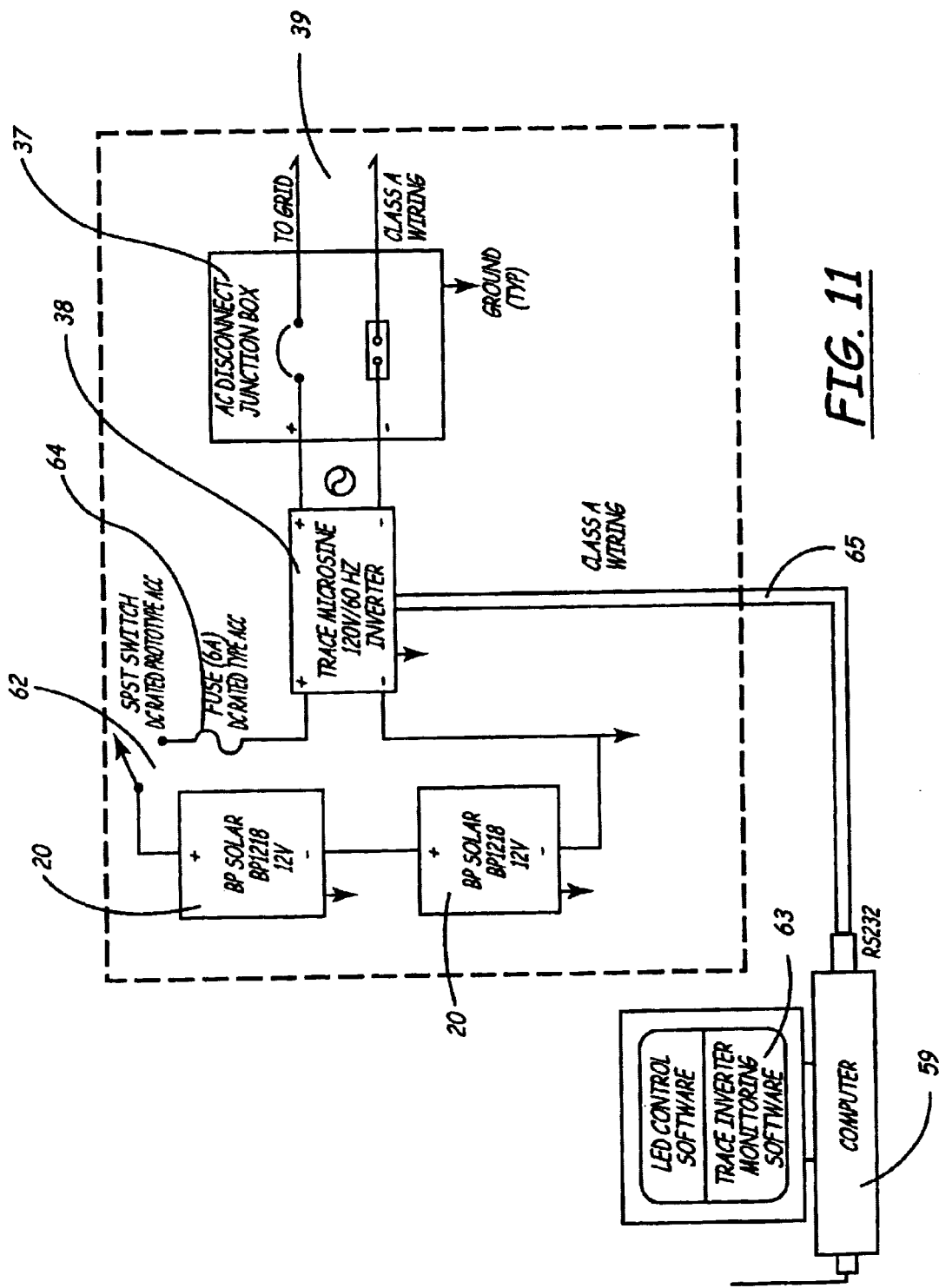
FIG. 11 is a wiring diagram for the AC embodiment of the photovoltaic panel in accordance with the present invention.

Reference is next made to FIG. 10 showing a circuit diagram for a DC circuit embodiment and FIG. 11 showing a circuit diagram for an AC circuit embodiment. In FIG. 10, the solar panel 20 is electrically connected to the controller 34 and the storage batteries 31 and 32 through the switches 56 and the fuses 58. The electrical DC power load from the controller 34 in accordance with the preferred embodiment is used to power the LED display 29. A PC 59 in conjunction with appropriate software 60 is provided for controlling operation of the LED display 29 through the line 61.

FIG. 11 shows a circuit diagram for an AC circuit embodiment. Specifically, the PV modules 20, connected in series or parallel to provide the most efficient input to the selected inverter, are electrically connected through the switch 62 and the fuse 64 to the DC to AC inverter 38. A PC 59 in conjunction with appropriate inverter monitoring software 63 is connected to the inverter 38 via the lines 65. Output from the inverter 38 is electrically connected with a junction box 37, with AC electrical power output 39 being provided to the power grid or an appliance or the like.

Although the description of the preferred embodiment has been quite specific, it is contemplated that various modifications could be made without deviating from the spirit of the present invention. Accordingly, it is intended that the scope of the present invention be dictated by the appended claims rather than by the description of the preferred embodiment.

What is claimed is:

1. The window structure comprising:
    an exterior frame defining the exterior perimeter of the window structure;
    a plurality of window panels positioned within said exterior frame, each of said plurality of window panels being defined at least in part by an interior frame portion;
    at least one of said window panels comprising a photovoltaic module comprised of a plurality of electrically connected photovoltaic cells electrically connected with one another in series, wherein said at least one panel has an exterior side and an interior side and wherein said plurality of photovoltaic cells are located on said exterior side;
    at least another of said window panels comprising vision glass; and
    an access panel located on said interior side.

2. The window structure of claim 1 wherein said at least one panel includes an edge frame member defining a peripheral edge of said at least one panel, said interior and exterior sides and said frame member defining a photovoltaic module interior.

3. The window structure of claim 2 including electrical power storage means positioned within said photovoltaic module interior.

4. The window structure of claim 3 including a power outlet.

5. The window structure of claim 4 including a DC to AC inverter positioned within said photovoltaic module interior.

6. The photovoltaic panel for use as one of a plurality of panels of a window structure having at least one window panel of vision glass, the photovoltaic panel comprising:
    an exterior frame extending around the periphery of the photovoltaic panel;
    an interior side and an exterior side, said frame and said interior and exterior sides defining a photovoltaic panel interior;
    a plurality of photovoltaic cells being electrically connected with one another; and
    an access door on said interior side.

7. The photovoltaic panel of claim 6 wherein said plurality of photovoltaic cells are electrically connected in series.

8. The photovoltaic panel of claim 6 including a display electrically powered by said plurality of photovoltaic cells.

9. The photovoltaic panel of claim 6 including electrical power storage means positioned in said panel interior.

10. The photovoltaic panel of claim 9 including a charge control means positioned in said panel interior.

11. The photovoltaic panel of claim 10 including an electrical power outlet.

12. The photovoltaic panel of claim 7 including a DC to AC inverter positioned within said panel interior.

13. The photovoltaic panel of claim 12 including an electrical power outlet.

* * * * *

UNITED STATES PATENT AND TRADEMARK OFFICE
CERTIFICATE OF CORRECTION

PATENT NO. : 6,646,196 B2
DATED : November 11, 2003
INVENTOR(S) : Steven B. Fronek and Thomas M. Mifflin It is certified that error appears in the above-identified patent and that said Letters Patent is hereby corrected as shown below:

Column 1,
Line 39, "Window" should be -- window -- therefor.

Column 3,
Line 10, "millions" should be -- mullions -- therefor.
Line 53, "aspacer" should be -- a spacer -- therefor.
Line 56, "ofthe" should be -- of the -- therefor.

Column 4,
Line 40, "Sun Saver 6" should be -- Sun Saver-6 -- therefor.

Column 6,
Line 24, "exterion sides and" should be -- exterior and -- therefor.

Signed and Sealed this

Eleventh Day of May, 2004

JON W. DUDAS
*Acting Director of the United States Patent and Trademark Office*